United States Patent [19]
White

[11] Patent Number: 4,797,608
[45] Date of Patent: Jan. 10, 1989

[54] D.C. POWER MONITOR
[75] Inventor: Randall A. White, Plainville, Mass.
[73] Assignee: Digital Equipment Corporation, Maynard, Mass.
[21] Appl. No.: 85,095
[22] Filed: Aug. 13, 1987
[51] Int. Cl.$^4$ .................... G01R 19/165; G01R 19/30
[52] U.S. Cl. ..................... 324/96; 324/133; 340/663
[58] Field of Search ................ 324/96, 102, 122, 133; 340/660–664; 318/490

[56] References Cited
U.S. PATENT DOCUMENTS

| | | | |
|---|---|---|---|
| 3,341,816 | 9/1967 | Davis et al. | 340/661 |
| 3,633,101 | 1/1972 | Johnson et al. | 324/102 |
| 3,702,469 | 11/1972 | Golja | 340/663 |
| 4,020,414 | 4/1977 | Paredes | 340/663 |
| 4,282,517 | 8/1981 | Wilson, Jr. et al. | 340/661 |
| 4,428,020 | 1/1984 | Blanchard, Jr. | 340/662 |
| 4,496,906 | 1/1985 | Clack | 324/133 |
| 4,559,497 | 12/1985 | Farrugia | 324/96 |
| 4,599,557 | 7/1986 | Cestaro | 324/133 |
| 4,638,304 | 1/1987 | Kimura et al. | 340/661 |

FOREIGN PATENT DOCUMENTS

| | | | |
|---|---|---|---|
| 0138474 | 7/1985 | Japan | 340/662 |
| 8203137 | 9/1982 | PCT Int'l Appl. | 340/661 |
| 1242842 | 7/1986 | U.S.S.R. | 324/133 |

OTHER PUBLICATIONS

"Power Failure Indicator", by Dance, New Electronics, vol. 9, #15, p. 14, 7/76.

Primary Examiner—Reinhard J. Eisenzopf
Assistant Examiner—W. Burns
Attorney, Agent, or Firm—Kenyon & Kenyon

[57] ABSTRACT

A DC power monitor includes a reference voltage and voltage dividers for obtaining voltages which are respectively above and below the reference level when the voltages being monitored are at their nominal value. Comparators compare the divided voltages with the reference and the comparator outputs are Anded and coupled through a flip flop to a bicolor LED which is one color when the voltages are in tolerance and another color when out of tolerance.

9 Claims, 2 Drawing Sheets

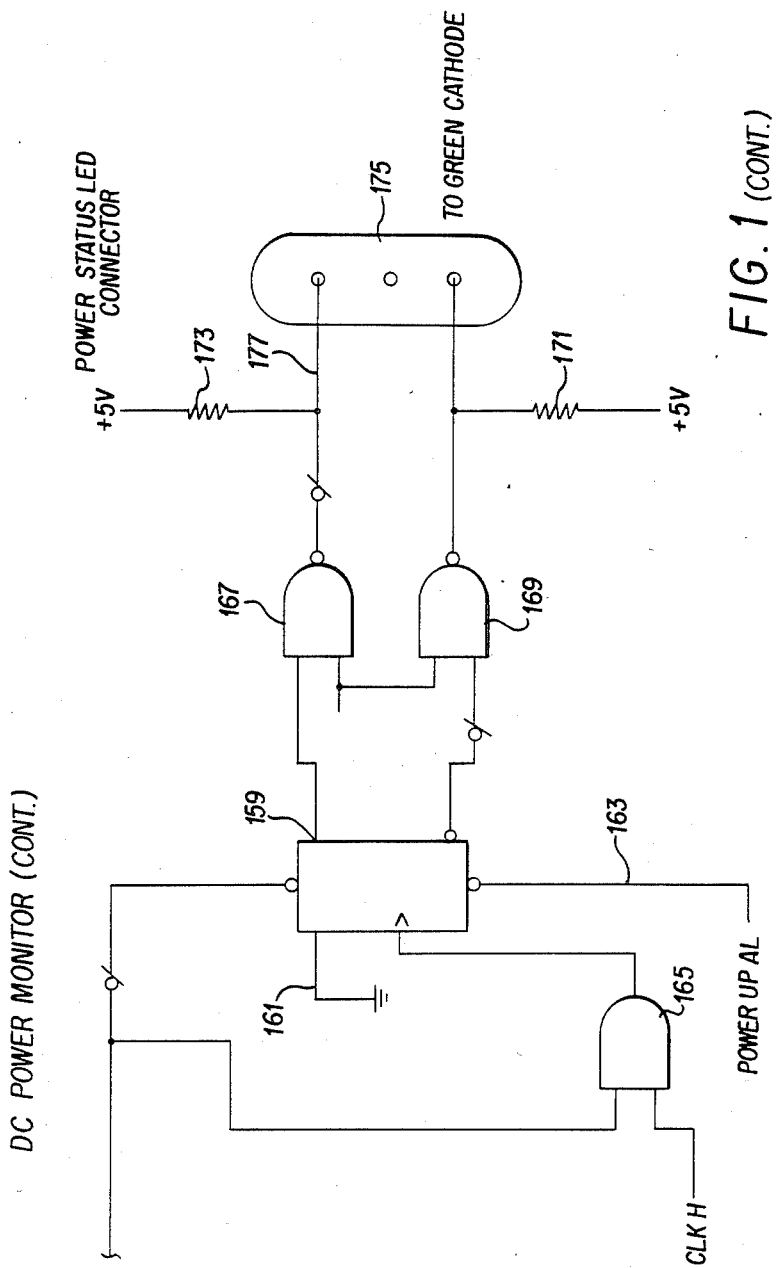

D.C. POWER MONITOR

RELATED APPLICATIONS

This application is related to the following applications filed on even date herewith, the disclosure of which is hereby incorporated by reference. These applications contain, at least in part, common disclosure regarding an embodiment of a peripheral repeater box. Each, however, contains claims to a different invention.

Peripheral Repeater Box Serial Number 07/085,097, filed 8/13/87.
Tri-State Function Indicator Serial Number 07/084,845 filed 8/13/87.
Method of Changing Baud Rate Serial number 07/085,084, filed 8/13/87.
System Permitting Peripheral
Interchangeability Serial number 07/085,105, filed 8/13/87.
Communications Protocol Serial number 07/085,096, filed 8/13/87.
Method of Packetizing Data Serial number 07/085,098, filed 8/13/87.

BACKGROUND OF THE INVENTION

This invention relates to electronic systems in general and more particularly, to a D.C. power monitor for use in a system which includes a plurality of power supplies.

Various electronic systems, such as the peripheral repeater box described in the above identified applications require a number of different power supplies. Thus, an indication of the proper operation of these supplies is quite desirable.

SUMMARY OF THE INVENTION

In accordance with the present invention, a DC power monitor is provided to monitor a plurality of power supplies and indicates power status with a bi-color LED. This monitor provides a rough indication of positive and negative 12 volt power supplies. If either supply is out of spec 10 to 15 percent then the LED will indicate a failure by changing its color. The DC power monitor is itself powered by a 5 volt supply. If the LED is out, this indicates failure of the 5 volt supply. Although disclosed in conjunction with +12 volts supplies and a 5 volt supply, the invention is, of course, applicable to other voltages.

BRIEF DESCRIPTION OF THE DRAWING

The single Figure is a schematic diagram of the DC power monitor of the present invention.

DETAILED DESCRIPTION

Figure 1:
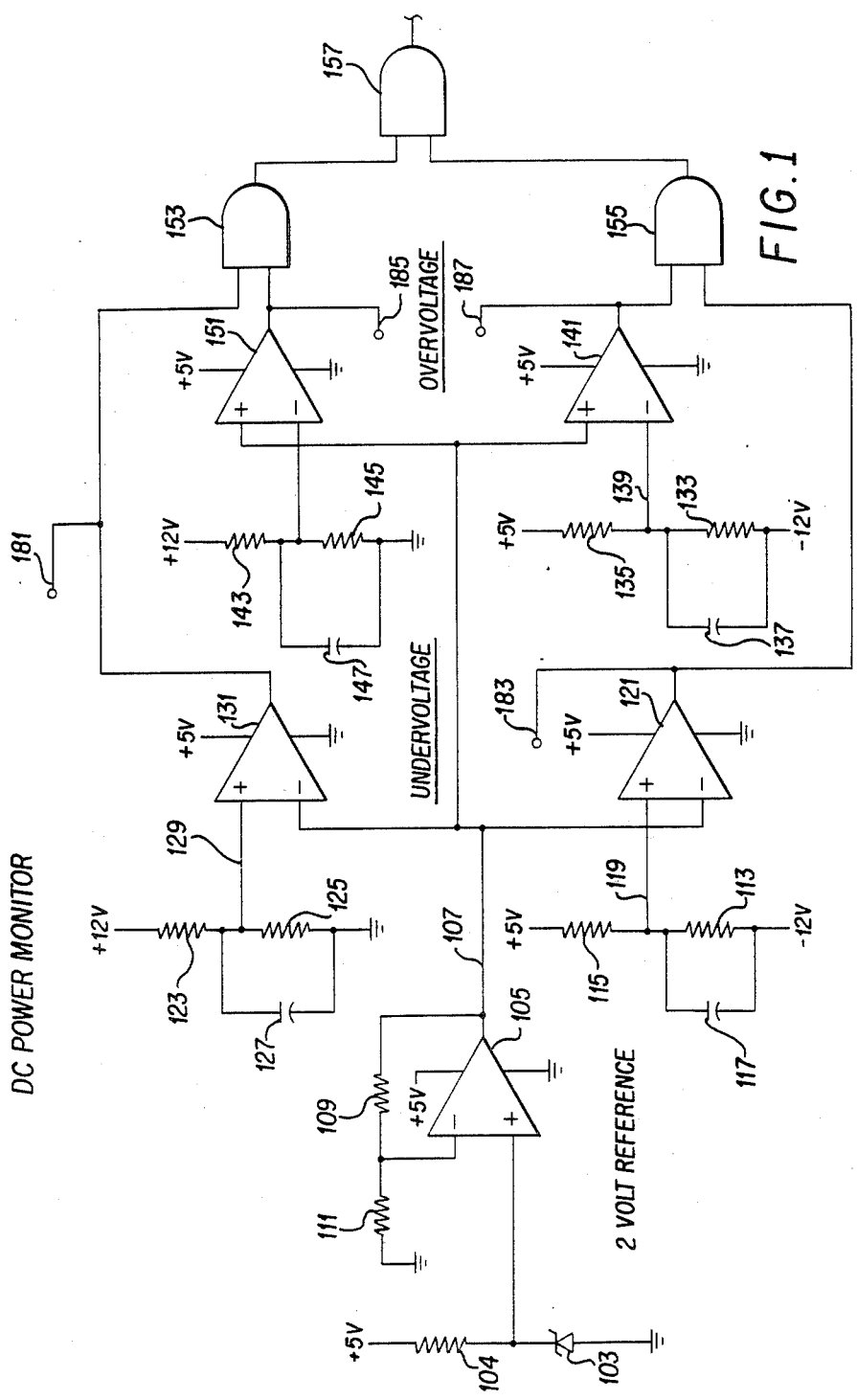

The single figure illustrates an embodiment of the DC power monitor of the present invention. The circuitry to monitor the plus and minus 12 v supplies operates from the +5 v. supply. A single red/green bicolor LED is connected to the output of the power monitor circuit. The output indicators are as follows:

| LED Indication | Description |
| --- | --- |
| Green | All voltages present and within range |
| Red | Either plus, minus or both 12 volt supplies are approximately 15% out of spec or dropped out completely |
| None | +5 v supply, all supply voltages dropped out or no AC |

The DC power monitor is a set of four comparators to check undervoltage and overvoltage out of range approximately 15% at nominal for the plus and minus 12 volt supplies. The circuit runs from plus five volts and uses a plus two volt precision reference applied to the appropriate reference input of each comparator. The output is connected to bicolor LED 64. Precision resistor dividers connected to the other input of each comparator, scale the test voltage down to the same range as the reference input.

The +5 volt supply is coupled across a series circuit of a resistor 101 and Zener diode 103. Zener diode 103 is a 1.25 volt Zener diode. The junction between resistor 101 and zener diode 103 is coupled to the non-inverting input of an amplifier 105. Amplifier 105 has its output on line 107 coupled through a resistor 109 to its inverting input. Also coupling the inverting input to ground is a resistor 111. In the preferred embodiment, resistor 109 has a resistance of 15 k and resistor 111 a resistance of 24.3 K. This gives a gain for amplifier 105 which results in a 2 volt output on line 107.

The −12 volt supply is coupled to a resistor 113 which is in series with a resistor 115 which has its other end coupled to the +5 volt supply. A capacitor 117 is coupled in parallel across resistor 113. Resistor 113, in the preferred embodiment, has a value of 15.8 K and resistor 115 a value of 3.01 K. If the −12 volt supply is exactly at −12 volts and the +5 volt supply at +5 volts, the resulting voltage at the junction between the two resistors, i.e., on line 119 will be approximately 2.8 volts. This 2.8 volts is compared with the 2 volts on line 107 in comparator 121.

The +12 volts supply is coupled to a resistor 123 in series with a resistor 125 which is connected to ground. Again, a capacitor 127 is coupled across resistor 125. The value of resistor 123 in the preferred embodiment is 8.25 k and the value of resistor 125, 2.2 k. Capacitors 117 and 127 are each preferably 0.01 microfarad. If the +12 volt supply is exactly 12 volts, with this divider, the voltage at the junction, i.e., on line 129 will also be above 2 volts. This voltage is compared in comparator 131 with the output of line 107.

In the case of comparator 121, the voltage to the non-inverting input from the voltage divider, if the full −12 volts is present, will be above the 2 volts on line 107. This will result in a high or logic "1" output from the respective comparators If the −12 voltage in question increases, however, above a predetermined amount, e.g. 15%, at some point the voltage on line 119 as the case may be, will fall below 2 volts and the output of comparator 121 will change from a logic "1" to a logic "0". Thus, comparator 121 detects an overvoltage condition for the −12 volt supply.

Similarly, if the +12 volt supply drops by, e.g. 15% the voltage on line 129 will fall below 2 volts and the output of comparator 131 will change from "1" to "0" indicating an undervoltage condition for the +12 volt supply.

To detect undervoltage on the −12 v supply, an additional voltage divider comprising resistors 133 and 135 is provided. Resistor 133 has its open end connected to the −12 volts supply and resistor 135, its open end to the +5 volt supply. Once again, a capacitor 137 is provided. For the +12 supply overvoltage detection, +12 volts is connected across a voltage divider comprising resistors 143 and 145 with the other side of resistor 145 connected to ground. Again a capacitor 147 is provided across resistor 145. Preferably capacitors 137 and 147 have a value of 0.01 uf. Resistor 133 has a value of 12.1 K, resistor 135 a value of 3.01 K, resistor 143 a value of 11.8 K and resistor 145 a value of 2 k. The ratios in these resistor dividers are chosen such that if the + and −12 volt supplies are at their normal levels, the voltages on lines 139 and 149 respectively will be below the 2 volt reference on line 107. As a result, the output of the respective comparators 141 and 151, since the reference in this case is provided to the noninverting input will be positive or a logic "1" so long as the voltage level does not increase above a predetermined amount. If one of the 12 volt supplies goes above a preestablished level, then the voltage on the inverting input of its comparator will exceed the voltage on the noninverting input and the state of the comparator will change from a logic "1" to a logic "0".

Note that for the minus 12 volt comparators the voltage is biased up with the plus five volt supply, this is done to keep negative voltages from being present on the inputs of the comparator.

The outputs of comparators 131 and 151 are combined in an And gate 153. Similarly, the outputs of comparators 121 and 141 are coupled to an And gate 155. The respective outputs of these And gates 153 and 155 are inputs to an And gate 157. And gate 157 is coupled to the preset input of a D-type flip-flop 159. The input of this flip-flop is coupled to ground by a line 161. Its clear input is coupled to a "power up" signal on line 163 so that the flip-flop is cleared on power up. Its clocking input is coupled to the output of an And gate 165 which has one input a clock signal with a frequency of about 30 KHz and has as its other input, the output of gate 157.

The logic "1" output of flip-flop 159 is provided as an input to an Nand gate 167 and the "0" output to an Nand gate 169. The second inputs of these Nand gates are a 3 volt signal. The outputs of Nand gates 167 and 169 are coupled to pull-up resistors 171 and 173 which are connected to +5 volts. They are also coupled to the red and green cathodes of a bi-color LED 175.

If the voltage levels are as they should be, there will be no output from gate 157. In that case, the flip-flop 159 will remain in its reset state and an output will be provided from its "0" output into gate 169 which will provide a "0" or ground level to the green cathode turning on the the green cathode to indicate proper operation. Should an undervoltage or overvoltage occur, the output of gate 157 will set flip-flop 159 through its connection to the preset input. As a result, an output will be provided on line 177 to the red cathode indicating that there is a problem in the power supply. The outputs of the four comparators are normally high and any fault detected will cause that output to go to low setting flip flop 159. The power problem can then be diagnosed by checking the test points 181, 183, 185 and 187 to find out which comparator is providing a signal indicating a voltage is not within tolerance. Upon correction of the defect, the preset signal is removed and the "0" at the D input, which is connected to ground, is transferred to the "1" output. The "0" output becomes high and the green cathode of LED 125 is lit.

Thus, as long as a fault condition exists the clock will be blocked and flip flop 159 will remain set. However, as soon as the fault condition goes away the clock will be enabled loading a zero in and thereby clearing flip flop 157. This has been done so that a transient condition will not latch up the indicator but rather that the indicator will indicate a hard fault condition.

What is claimed is:

1. A DC power monitor for monitoring at least first and second voltages comprising:

means for establishing a reference voltage level from a third voltage source;

first means for dividing said first voltage to obtain a first divided voltage higher than said reference voltage when said first voltage is at its nominal level;

a first comparator for comparing said first divided voltage and said reference voltage to provide a first output having a first level when said first divided voltage is above said reference voltage and a second level when below;

second means for dividing said second voltage to obtain a second divided voltage higher than said reference when said second voltage is at its nominal value;

a second comparator for comparing said second divided voltage with said reference having an output at said first level when said second divided voltage is above said reference voltage and a second level when below;

third means for dividing said first voltage to obtain a third divided voltage lower than said reference voltage when said first voltage is at its nominal value;

a third comparator for comparing said third divided voltage with said reference voltage and providing an output at said first level when said third divided voltage is lower than said reference voltage and of said second level when above;

fourth means for dividing said second voltage to obtain a fourth divided voltage lower than said reference voltage;

a fourth comparator for comparing said fourth divided voltage with said reference voltage and providing an output at said first level when said third divided voltage is lower than said reference voltage and of said second level when above;

said first and second voltages are respectively positive and negative voltages, wherein said third source voltage is also a positive voltage and wherein said first voltage of said first and third voltage dividing means is coupled to one end of its respective voltage dividing means with the other end thereof coupled to ground and said second, negative voltage of said second and fourth voltage dividing means is coupled to one end of its respective voltage dividing means with the other end thereof coupled to said third source voltage, whereby in each case positive voltages can be provided as inputs to said comparators for comparison with said positive reference voltage;

means for Anding the outputs of said first, second, third and fourth comparators;

an LED with first and second cathodes providing two colors; and means having as an input the output of said means Anding said comparator signals, said means providing first and second outputs to said first and second cathodes for respectively energizing a first and second color thereof, said means providing a signal which energizes one color of said LED when a signal is present from said Anding means and energizing the other color when said signal is not present from said Anding means.

2. Apparatus according to claim 1 wherein each of said dividing means comprises a resistor voltage divider.

3. Apparatus according to claim 2 wherein the said reference voltage is provided as an input to the inverting inputs of said first and second comparators with the outputs of said first and second voltage dividers provided to the noninverting inputs thereof and wherein said reference voltage is provided to the non-inverting inputs of said third and fourth comparators and the outputs of said third and fourth voltage dividers are provided as inputs to the inverting inputs thereof.

4. Apparatus according to claim 3 wherein said means for Anding comprise a first And gate for Anding the outputs of said first and third comparators; a second And gate for Anding the outputs of said second and fourth comparators; and a third And gate for Anding the outputs of said first and second And gates.

5. Apparatus according to claim 4 wherein said means for energizing comprise:
a D type flip flop having its preset input coupled to the output of said third And gate and having its D input coupled to ground to provide a logic 0 signal; means providing a clock signal; and
means coupling said clock signal to the clock input of said flip flop whereby, when a signal is present from said third And gate indicating that a voltage is out of range, said flip flop will be preset providing a logic "1": signal on its "1" output and a logic "0" signal on its "0" output to energize a first cathode of said LED and whereby, if said preset input is not present, said clock will clock to said logic "0" signal at its D input to its "1" output to thereby cause a logical "1" level to be present on the "0" output of said flip flop to energize the other cathode of said LED.

6. Apparatus according to claim 5 wherein said LED has red and green cathodes and wherein said output indicating a voltage out of tolerance energizes said red cathode and said output indicative of normal operation energizes said green cathode and wherein an absence of any light is indicative of a failure of said third power supply.

7. A method for monitoring at least first and second DC voltages being positive and negative voltages, respectively, comprising:
establishing a reference voltage level from a third voltage source, said third voltage source being a positive voltage;
coupling said first voltage to one end of a first and second means for dividing and coupling the other end to ground;
dividing the first voltage in the first dividing means to obtain a first divided voltage higher than said reference voltage;
comparing said first divided voltage with said reference voltage to provide a first output;
dividing said first voltage in the second dividing means to obtain a second divided voltage lower than said reference voltage;
comparing said second divided voltage with said reference voltage to provide a second output;
coupling said second voltage to one end of a third and fourth means for dividing and coupling the other end to the third voltage, whereby in each case positive voltages can be provided as inputs for comparing with the reference voltage;
dividing said second voltage in the third dividing means to obtain a third divided voltage lower than said reference voltage;
comparing said third divided voltage with said reference voltage to provide a third output;
dividing said second voltage in the fourth dividing means to obtain a fourth divided voltage higher than said reference voltage;
comparing said fourth divided voltage with said reference voltage to provide a fourth output;
Anding said first, second, third and fourth outputs to obtain a fifth output; and
energizing one color cathode of a two color LED if said fifth output is present and the other cathode if said fifth output is not present.

8. A method according to claim 7 wherein the step coupling of to said first, second, third and fourth dividing means is carried out by coupling to a first, second, third and fourth resistor divider respectively.

9. A method according to claim 8 wherein the step of energizing is carried out with a D type flip flop.

* * * * *